United States Patent [19]
Hattori et al.

[11] Patent Number: 5,846,886
[45] Date of Patent: Dec. 8, 1998

[54] METAL FILM ETCHING METHOD

[75] Inventors: Kei Hattori, Yokohama; Akira Kobayashi, Nagoya; Mikio Nonaka, Sagamihara; Makoto Muto, Ayase; Masaru Kasai, Zama; Toshiyasu Onoda, Edogawa-Ku; Tomoaki Yoshimori, Zama, all of Japan

[73] Assignees: Kabushiki Kaisha Toshiba, Kawasaki; Shibaura Engineering Works Co., Ltd., Tokyo-To, both of Japan

[21] Appl. No.: 808,854

[22] Filed: Feb. 28, 1997

[30] Foreign Application Priority Data

Mar. 1, 1996 [JP] Japan .................................. 8-044966

[51] Int. Cl.$^6$ .................................. H01L 21/302
[52] U.S. Cl. .................. 438/740; 438/697; 438/710; 438/723
[58] Field of Search .................. 438/697, 710, 438/723, 740

[56] References Cited

U.S. PATENT DOCUMENTS

| | | | |
|---|---|---|---|
| 4,824,802 | 4/1989 | Brown et al. | 437/192 |
| 4,980,018 | 12/1990 | Mu et al. | 156/643 |
| 5,164,330 | 11/1992 | Davis et al. | 437/192 |
| 5,231,051 | 7/1993 | Baldi et al. | 437/187 |
| 5,514,604 | 5/1996 | Brown | 437/203 |

FOREIGN PATENT DOCUMENTS

| | | |
|---|---|---|
| 6-045326 | 2/1994 | Japan . |
| 7-074243 | 3/1995 | Japan . |

OTHER PUBLICATIONS

"Plasma Etching Methods for the Formation of Planarized Tungsten Plugs Used in Multilevel VLSI Metallizations"; J. Elect. Soc., Solid State Sci. and Tech.; pp. 936–940; Saia et. al., Apr. 1988; vol. 135; No. 4.

"Etchback of Blanket Tungsten Films In a Hexode Reactor"; Robb et. al., 1988; Abstract Only; Proc.–Elect. Soc., 89–6; ISSN: 0161–6374.

*Primary Examiner*—R. Bruce Breneman
*Assistant Examiner*—George Goudreau
*Attorney, Agent, or Firm*—Oblon, Spivak, McClelland, Maier & Neustadt, P.C.

[57] ABSTRACT

A metal film etching method etches selectively a metal film formed on a layer insulating film provided with viaholes so as to cover the surface of the layer insulating film and fill up the viaholes so that the metal film excluding portions there of filling up the viaholes are removed completely without forming a pit in the portions of the metal film filling up the viaholes. The metal film etching method uses a mixed reactive gas of a gas containing fluorine atoms, a gas containing chlorine atoms and oxygen gas.

6 Claims, 5 Drawing Sheets

| $CL_2/(CF_4+O_2)$ | 0% | 5% | 10% | 30% |
|---|---|---|---|---|
| SHAPE OF TUNGSTEN FILM FILLING UP VIAHOLE | SILICON OXIDE FILM / TUNGSTEN FILM / SILICON WAFER | SILICON OXIDE FILM / TUNGSTEN FILM / SILICON WAFER | SILICON OXIDE FILM / TUNGSTEN FILM / SILICON WAFER | SILICON OXIDE FILM / TUNGSTEN FILM / SILICON WAFER |

METAL FILM ETCHING METHOD

BACKGROUND OF THE INVENTION

1. Field of the Invention

The present invention relates to a metal film etching method and, more particularly to an etching method which flattens a metal film formed on a layer insulating film provided with viaholes therein.

2. Description of Related Art

There is a known technique which forms viaholes in a layer insulating film formed on a semiconductor wafer by a dry etching process, deposits a titanium film and a titanium compound film, i.e., a barrier metal film, by a sputtering process, and forms a tungsten film to fill up the viaholes by a CVD process. The CAD process forms the tungsten film not only in the viaholes, but also on the layer insulating film. Therefore, portions of the tungsten film other than those deposited in the viaholes need to be removed. A CMP method and a RIE method are representative methods of removing such a tungsten film.

The CMP method has difficulty in detecting a grinding end point where the tungsten film is removed completely, and grinds the barrier metal layer underlying the tungsten film after completely removing the tungsten film.

The RIE method damages a film underlying a film to be removed, by ion implantation and the turbulence of crystals because charged particles produced in a plasma is accelerated by self-bias and accelerated charged particles fall on the film to be etched.

SUMMARY OF THE INVENTION

Accordingly, it is an object of the present invention to provide a metal film etching method which flattens a tungsten film formed on a tungsten alloy film formed on a layer insulating film formed on a substrate and provided with viaholes, selectively leaving portions of the tungsten film deposited in the viaholes without forming any neck in the portions of the tungsten film deposited in the viaholes.

According to one aspect of the present invention, a metal film etching method for etching a metal film formed on a layer insulating film provided with viaholes formed by etching, so as to cover the layer insulating film and fill up the viaholes, to remove the metal film excluding portions thereof deposited in the viaholes uses a mixed reactive gas of a gas containing fluorine atoms, a gas containing chlorine atoms and oxygen gas for etching the metal film.

A preferable gas containing fluorine atoms is any one of $CF_4$, $C_2F_6$, $C_3F_8$, $NF_3$ and $SF_6$.

Desirably, the gas containing chlorine atoms is $Cl_2$.

The metal film is a tungsten film or a tungsten alloy film formed on a composite film of a titanium film and a titanium compound film. The tungsten film or the tungsten alloy film is etched selectively. Preferably, the temperature of the wafer is 40° C. or below when etching the tungsten film or the tungsten alloy film at an infinite etch selectivity far greater than those for the titanium film and the titanium compound film.

It is preferable to etch selectively portions of the tungsten film or the tungsten alloy film other than those deposited in the viaholes by a downstream discharge chemical dry etching process.

Preferably, the reactive gas has an oxygen concentration in the range of 30 to 90% and a chlorine-atom-containing gas concentration in the range of 5 to 30%.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
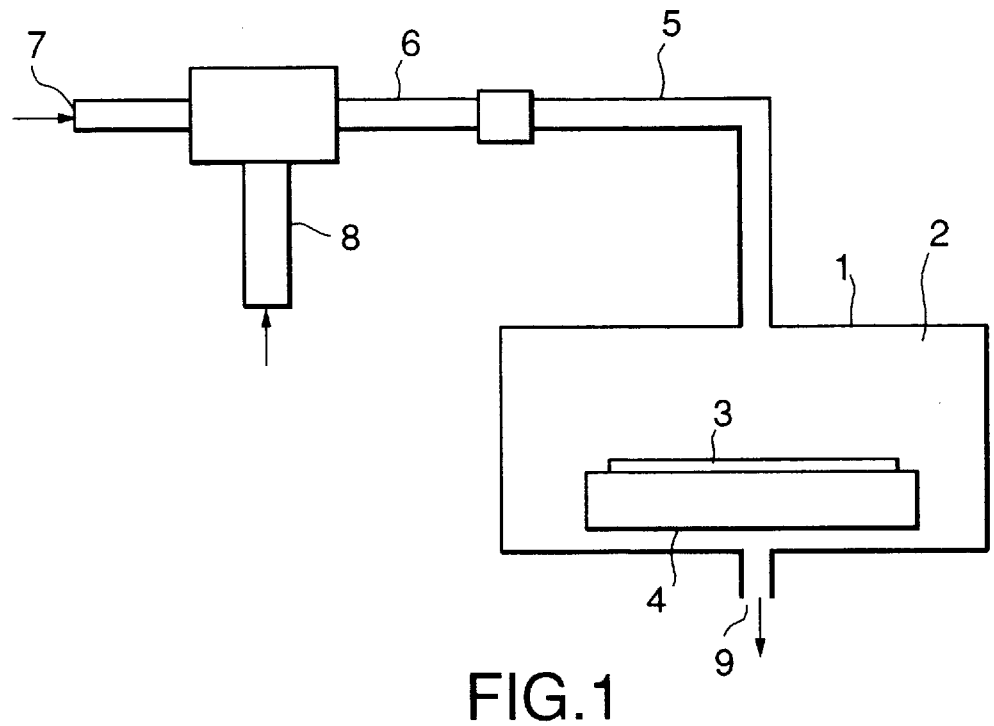
FIG. 1 is a diagrammatic view of a downstream discharge chemical dry etching system for carrying out a metal film etching method in a preferred embodiment according to the present invention.

Referring to FIG. 1 showing a downstream discharge chemical dry etching system for carrying out a metal film etching method in a preferred embodiment according to the present invention, a workpiece table 4 for supporting a workpiece 3 is placed in an etching chamber 2 defined by a vacuum vessel 1. The workpiece table 4 is provided with a temperature regulating mechanism for regulating the temperature of the workpiece 3 supported thereon. A gas supply pipe 5 has one end connected to the top wall of the vacuum vessel 1 and the other end connected to a discharge pipe 6 having a gas inlet 7 through which a gas is supplied to the discharge pipe 6. A microwave waveguide 8 is connected to the discharge pipe 6. A gas supplied through the gas inlet 7 into the discharge pipe 6 is energized by a microwave transmitted through the microwave waveguide 8 to produce a plasma, charged species contained in the plasma is guided into the etching chamber 2 in which the workpiece 3 is supported on the workpiece table 4 to etch the workpiece 3. A reactive gas which has reacted with the workpiece 3 is discharged outside from the etching chamber 2 through an outlet 9.

Figure 2:
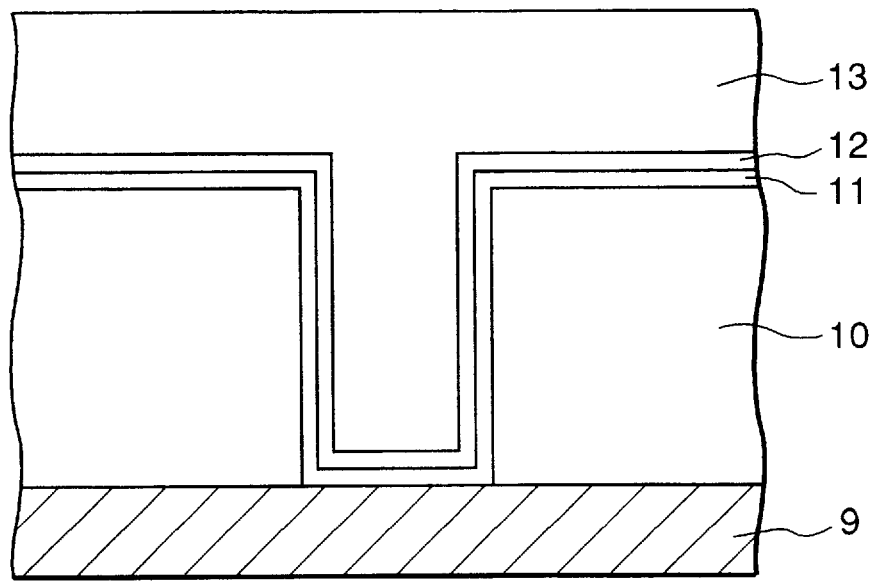
FIG. 2 is a fragmentary typical sectional view of a workpiece to be etched by the metal etching method of the present invention.

Referring to FIG. 2, a workpiece 3 is fabricated by forming a silicon dioxide film 10 on s silicon wafer 9, forming holes in the silicon dioxide film 10 by using a resist film as a mask by a dry etching process, forming a titanium film 11 and a titanium nitride film 12 in that order over the silicon dioxide film 10 by a sputtering process, and a tungsten film 13 is formed over the titanium nitride film 12 by a CVD (chemical vapor deposition) process.

Figure 3:
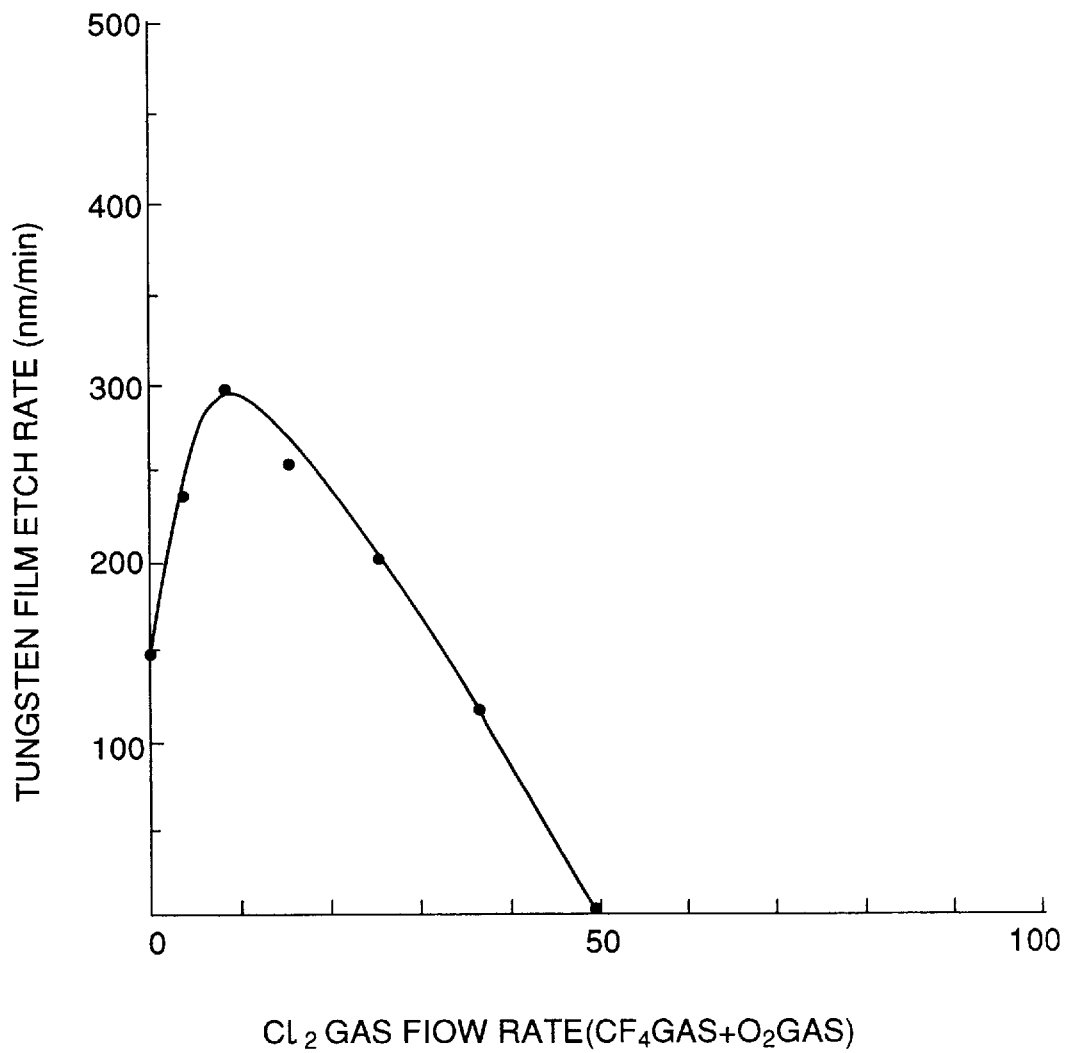
FIG. 3 is a graph showing the dependence of tungsten film etch rate on the flow rate ratio of $Cl_2$ gas.

The workpiece 3 provided with the metal films shown in FIG. 2 was subjected to an etching process carried out by the downstream discharge chemical dry etching system shown in FIG. 1. A mixed reactive gas containing $CF_4$ gas, $O_2$ gas and $Cl_2$ gas was used. A mixed reactive gas of $CF_4$ gas and $O_2$ gas was supplied at 200 sccm, a microwave of 700 W was used to produce a plasma, the etching chamber 2 was evacuated to 40 Pa and the workpiece table 4 was heated at 25° C. The flow rate ratio of $Cl_2$ gas, i.e., the ratio of the flow rate of $Cl_2$ gas ($Cl_2$ flow rate) to the sum of the respective flow rates of $CF_4$ gas and $O_2$ gas ($CF_4+O_2$ flow rate), was varied between 0% and 50% to examine the dependence of tungsten film etch rate on the flow rate ratio of $Cl_2$ gas. As shown in FIG. 3, tungsten film etch rate increases with the increase of the $Cl_2$ gas flow rate ratio in the range of $Cl_2$ gas flow rate ratio of 0% to 10%, reaches a peak at a $Cl_2$ gas flow rate ratio of 10%, and decreases with the increase of the $Cl_2$ gas flow rate ratio in the range of $Cl_2$ gas flow rate ratio of 10% to 50%. When the $Cl_2$ gas flow rate ratio was 50%, the tungsten film was etched scarcely. The titanium nitride film 12 was not etched regardless of the $Cl_2$ gas flow rate ratio.

Figure 4:
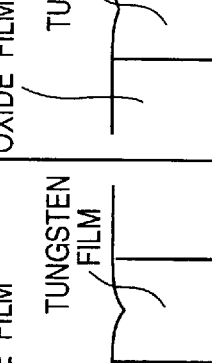
FIG. 4 is a diagrammatic view of assistance in explaining the dependence of the shape of a metal film formed in a viahole on the flow rate ratio of $Cl_2$ gas.

FIG. 4 shows shapes of the upper surfaces of portions of the tungsten film deposited in the viahole after being etched by dry etching processes using $Cl_2$ gas flow rate ratios of 0%, 5%, 10% and 30%, respectively. A pit is formed in the surface of the portion of the tungsten film deposited in the viahole when the $Cl_2$ gas flow rate ratio is 0%, and any pit is not formed in the surface of the portion of the tungsten film when the $Cl_2$ gas flow rate ratio is 5% or above.

Such a difference in the shape of surface between portions of the tungsten film etched by using the reactive gas at different $Cl_2$ gas flow rate ratios is considered to be attributable to the following reasons.

Figure 5:
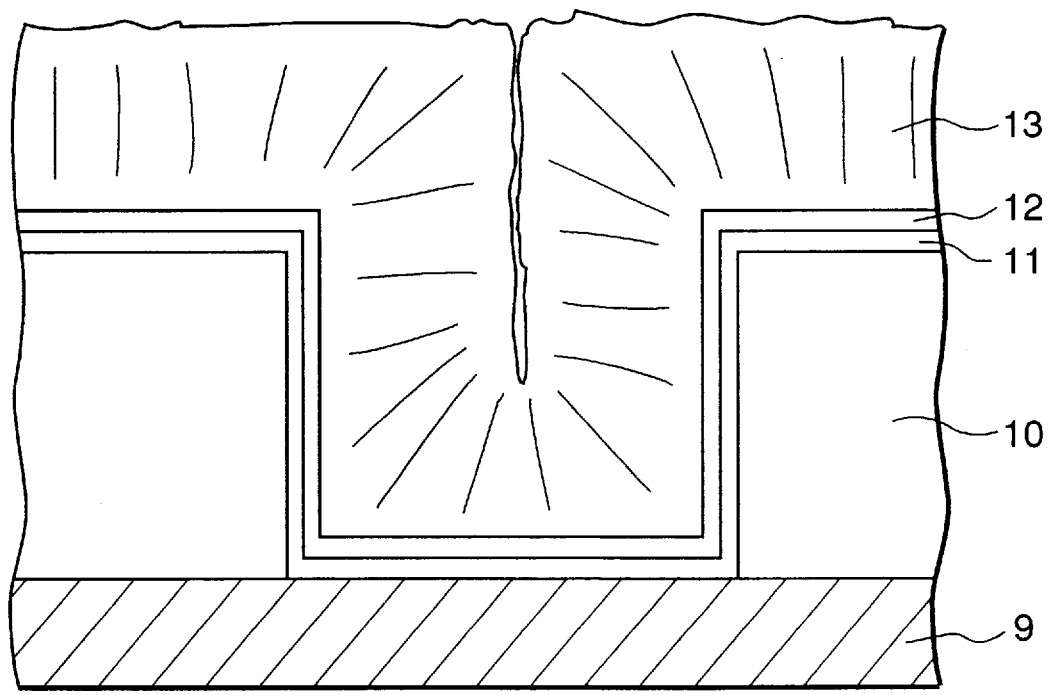
FIG. 5 is a typical sectional view of a viahole.

If the tungsten film 13 is deposited by a CVD process, the tungsten film 13 grows along steps in the silicon dioxide film. Therefore, as shown in FIG. 5, the tungsten film starts growing from the surface of the viahole and stops growing on the center axis of the viahole. The growth of a portion of the tungsten film 13 over the viahole is affected by the viahole; that is, the portion of the tungsten film 13 grows toward an extension of the center axis of the viahole and, consequently, the surface of the tungsten film assumes a shape resembling the step in the silicon dioxide film. If the tungsten film thus deposited is etched by a downstream discharge chemical dry etching method by using active species produced by discharge in a mixed gas of $CF_4$ gas and $O_2$ gas, and containing fluorine radicals as principal component, the tungsten film is etched from the surface. Therefore, a central portion of the portion of the tungsten film deposited in the viahole and the portion of the tungsten film over the viahole are etched substantially simultaneously and, consequently, a pit is formed in the central portion of the portion of the tungsten film deposited in the viahole after the portion of the tungsten film over the viahole has completely been removed. Since the tungsten film is easily oxidized, a tungsten oxide film is formed in the surface of the tungsten film. Therefore, the etching action of fluorine radicals is expressed by:

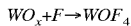

Since both the fluorides, i.e., $WF_6$ and $WOF_4$, have high vapor pressures, respectively, the fluorides are etched easily and the tungsten film is etched from its surface. Consequently, the tungsten film is etched substantially along the shape of the stepped part and a pit is formed in the portion of the tungsten film deposited in the viahole.

If the mixed reactive gas contains $Cl_2$ gas in a $Cl_2$ gas concentration of 5% or above, chlorine radicals are produced additionally. As mentioned in "Solid State Technology", p. 127, (April, 1988), if $Cl_2$ gas is added to a mixed reactive gas of $CF_4$ gas, $O_2$ gas and $N_2$ gas employed by a downstream discharge chemical dry etching method, FCl radicals are produced and FCl radicals suppresses the etching of the silicon dioxide film. It is inferred from this fact that the tungsten oxide film formed in the surface of the tungsten film is etched at a low etch rate. Since the portion of the tungsten film deposited in the viahole starts growing from the surface of the viahole and grows unevenly, it is considered that the portion of the tungsten film deposited in the viahole has an irregular surface, the reactive gas is unable to reach the irregular surface easily owing to conductance, and hence the tungsten oxide film formed in the surface of the portion of the tungsten film deposited in the viahole is difficult to etch. It is considered that the amount of fluorine radicals decreases and thereby the etch rate is reduced, if the $Cl_2$ gas concentration of the reactive gas is 50% or above. Therefore, a desirable $Cl_2$ gas concentration is in the range of 5 to 30%.

Figure 6:
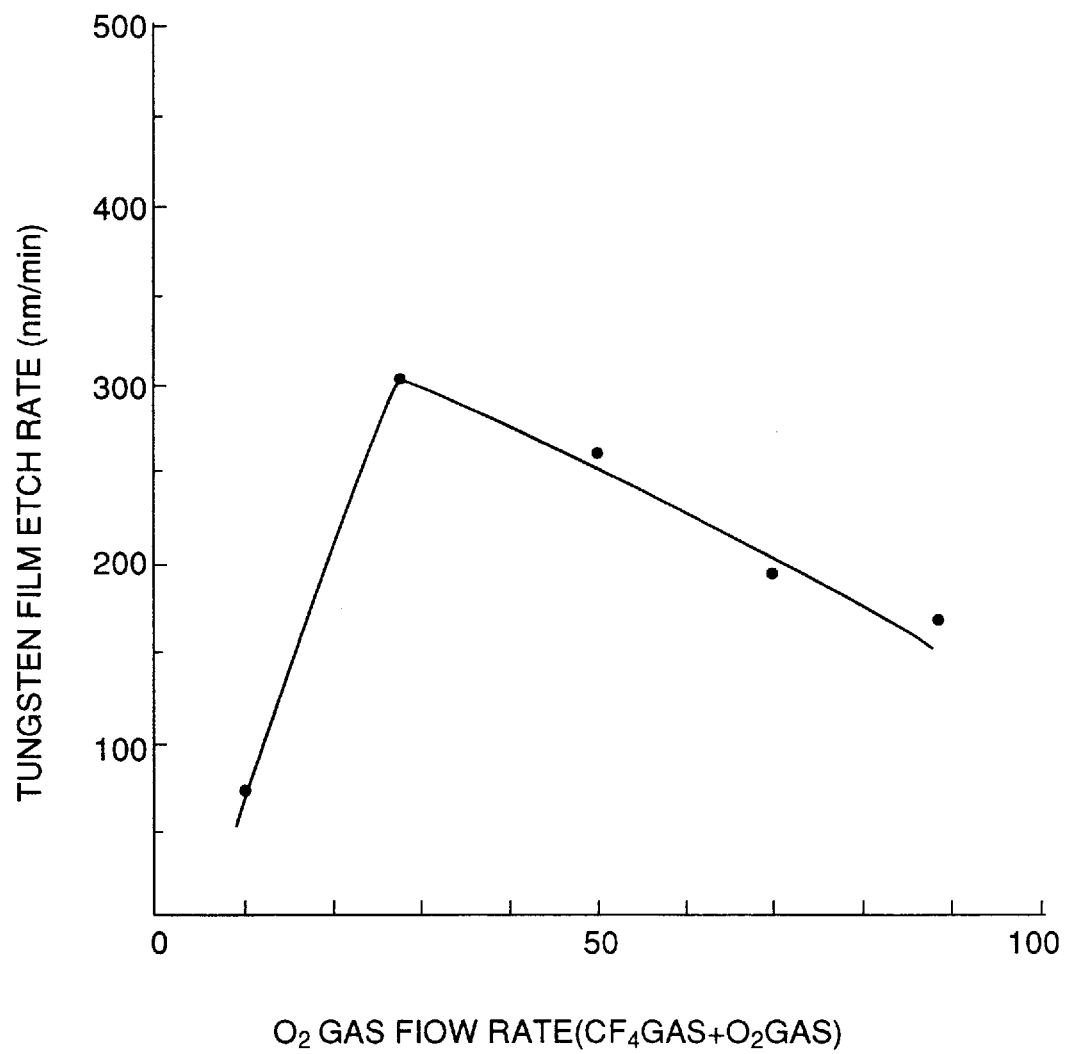
FIG. 6 is a graph showing the dependence of tungsten film etch rate on the flow rate ratio of $O_2$ gas.

FIG. 6 is a graph showing the dependence of tungsten film etch rate on the flow rate ratio of $O_2$ gas, i.e., the ratio of the flow rate of $O_2$ gas to the sum of the respective flow rates of $O_2$ gas and $CF_4$ gas equal to 200 sccm. A mixed reactive gas of $CF_4$ gas and $O_2$ gas was supplied at 200 sccm, a microwave of 700 W was used to produce a plasma, the etching chamber 2 was evacuated to 40 Pa and the workpiece table 4 was heated at 25° C. and the $Cl_2$ gas concentration of the reactive gas was 10%. The flow rate ratio of $O_2$ gas, i.e., the ratio of the flow rate of $O_2$ gas ($O_2$ flow rate) to the sum of the respective flow rates of $CF_4$ gas and $O_2$ gas ($CF_4+O_2$ flow rate), was varied to examine the dependence of tungsten film etch rate on the flow rate ratio of $O_2$ gas. As shown in FIG. 6, tungsten film etch rate increases with the increase of the $O_2$ gas flow rate ratio in the range of $O_2$ gas flow rate ratio of 0% to 30%, reaches a peak at a $O_2$ gas flow rate ratio of 30%, and decreases with the increase of the $O_2$ gas flow rate ratio in the range of $O_2$ gas flow rate ratio beyond 30%. An $O_2$ gas flow rate ratio in the range of 0% to 30%, in which the tungsten film etch rate increases sharply with the increase of $O_2$ gas flow rate ratio, is practically difficult to use. Therefore, am $O_2$ gas flow rate ratio in the range of 30% to 90% is desirable.

A gas containing fluorine other than $CF_4$ gas, such as any one of $C_2F_6$, $C_3F_8$, $NF_3$ and $SF_6$ gas may be used.

Although the foregoing embodiment heats the workpiece table at 25° C. to make the tungsten nitride film etch selectivity infinite, the workpiece table heated at a temperature not higher than 46° C.

The tungsten film may be etched by a dry etching process other than the downstream discharge chemical dry etching process provided that the dry etching process has a low self-bias effect. Possible dry etching processes are an ECR etching process, an ICP etching process and such.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A metal film etching method comprising etching a metal film formed on a layer insulating film provided with viaholes formed by etching, so as to cover the layer insulating film and fill up the viaholes, to remove the metal film excluding portions thereof deposited in the viaholes, carrying out said metal film etching method using a mixed reactive gas of a gas containing fluorine atoms, a gas containing chlorine atoms and oxygen gas for etching the metal film and wherein the metal film is a tungsten film or a tungsten alloy film formed on a film consisting of a titanium film and/or titanium compound film, and the tungsten film or the tungsten alloy film is etched selectively over the titanium film and/or the titanium compound film.

2. The method according to claim 1, wherein the gas containing fluorine atoms is selected from the group consisting of $CF_4$, $C_2F_6$, $C_3F_8$, $NF_3$ and $SF_6$.

3. The method according to claim 1, wherein the gas containing chlorine atoms is $Cl_2$.

4. The method according to claim 1, wherein the tungsten film or the tungsten alloy film is etched at an etching rate which is far greater than those for the titanium film and/or the titanium compound film.

5. The method according to claim 1, wherein portions of the tungsten film or the tungsten alloy film other than those deposited in the viaholes is etched selectively by a downstream discharge chemical dry etching process.

6. The method according to claim 3, wherein, the mixed reactive gas has an oxygen concentration in the range of 30 to 90% and a $Cl_2$ gas concentration in the range of 5 to 30%.

* * * * *